April 16, 1957 M. MARKS ET AL 2,789,213

CASCODE AMPLIFIER-MIXER WITH TRAP TO PREVENT LOCAL OSCILLATOR IN DRIVEN STAGE FROM AFFECTING DRIVING STAGE

Filed June 2, 1955

ROBERT ADLER
MEYER MARKS
*INVENTORS.*

BY John J. Pederson
THEIR ATTORNEY.

United States Patent Office 2,789,213

Patented Apr. 16, 1957

2,789,213

CASCODE AMPLIFIER-MIXER WITH TRAP TO PREVENT LOCAL OSCILLATOR IN DRIVEN STAGE FROM AFFECTING DRIVING STAGE

Meyer Marks, Clarendon Hills, and Robert Adler, Northfield, Ill., assignors to Zenith Radio Corporation, a corporation of Illinois Application June 2, 1955, Serial No. 512,731

5 Claims. (Cl. 250—20)

This invention relates to wave-signal translating circuits and more particularly to cascode-coupled circuits for use in wave-signal receivers and the like.

The early models of radar receivers produced during the second World War incorporated input amplifier stages having undesirably high noise levels. Research efforts were therefore directed to a quest for a high-frequency amplifier circuit having both a good noise figure and substantial gain. This work led to the development of the cascode amplifier circuit, which comprises two triodes and has the noise figure of a triode but the gain and the separation between input and output circuits characteristic of a pentode. Radio-frequency input signals are coupled to the control grid of the first triode; the cathode of the first triode is at ground for input signal frequencies. Inductive neutralization, comprising an inductance connected from plate to grid, is sometimes employed in the first triode stage. The plate circuit of the first triode is coupled to the cathode of the second triode, and the control grid of the second triode is at ground for input-signal frequencies, so that the dynamic cathode resistance of the second tube constitutes the output load for the first. The internal plate-to-cathode resistance of the first tube is usually many times larger than the dynamic cathode resistance of the second; this means there is little amplification, with an attendant good noise figure, in the first stage, and most of the amplification of a cascode amplifier is realized in the second triode. The plate circuit of the second triode may be coupled to a mixer or converter stage, which provides an intermediate-frequency output signal. The gain of the circuit comprising the two triodes varies jointly as the transconductance of the first and the plate load resistance of the second; the noise figure of the combination is essentially that of the first. This circuit produced excellent results in radar receivers, and subsequently was enthusiastically adopted by the communications industry. Today cascode amplifiers are widely employed in the input stages of commercially produced television receivers.

Conventionally the output of a cascode amplifier is coupled to a mixer or converter stage; a heterodyne-frequency signal, generated by a local oscillator, is also applied to the mixer or converter stage, and the preferred output of that stage (i. e., the desired intermodulation product) is coupled to the intermediate-frequency channel of the receiver. If it is attempted to combine the conversion function with the cascode amplifier by injecting the heterodyning signal at the grid of the second triode and providing an intermediate-frequency plate load, serious difficulties are encountered.

To obtain efficient conversion in the second triode, it is necessary to apply a heterodyne signal of a magnitude sufficient to completely interrupt the flow of space current in that triode once during each period of the heterodyning signal. Because the two triodes are in series relation with respect to signal currents and because the heterodyne frequency is normally of the same order of magnitude as the input-signal frequency, it is impossible to produce a large current at the heterodyne frequency in the second triode without concurrently doing so in the first; such a result destroys the advantageous separation of input and output normally associated with the cascode circuit. It leads to undesired conversion in the first triode, with a consequent impairment of the signal-to-noise ratio. Moreover, backcoupling through the first triode permits heterodyne-frequency radiation from the receiver's antenna circuits. In practice, these factors render such a system completely unsuitable for use in a television receiver or the like.

It is an object of this invention to produce a wave-signal translating circuit having substantially the noise figure and separation properties of a cascode amplifier, but also performing one or more functions in addition to the conventional amplifier action.

It is another object of this invention to eliminate, without materially detracting from performance, one or more of the stages conventionally employed in a superheterodyne television receiver.

It is a further object of the invention to provide a wave-signal translating circuit having the inherent advantages of a cascode amplifier and performing the additional function of frequency conversion, without introducing either undesirable conversion in the first stage or undesirable backcoupling of local oscillator signal energy to the first stage and the antenna circuits.

In accordance with the invention a wave-signal receiver comprises a radio-frequency amplifier including a first electron-discharge device having input and output circuits tuned to a predetermined signal frequency, and a second electron-discharge device cascode-coupled to the first device and provided with an output circuit tuned to a predetermined intermediate frequency which is equal to the difference between the signal frequency and the heterodyne frequency. The receiver additionally includes means for varying the transconductance of the second electron-discharge device at the heterodyne frequency to cause intermodulation with the signal frequency and develop an intermediate-frequency output signal across the output circuit of the second electron-discharge device.

The features of the present invention which are believed to be novel are set forth with particularity in the appended claims. The invention, together with further objects and advantages thereof, may best be understood by reference to the following description taken in connection with the accompanying drawings, in the several figures of which like reference numerals identify like elements, and in which:

Figure 1:
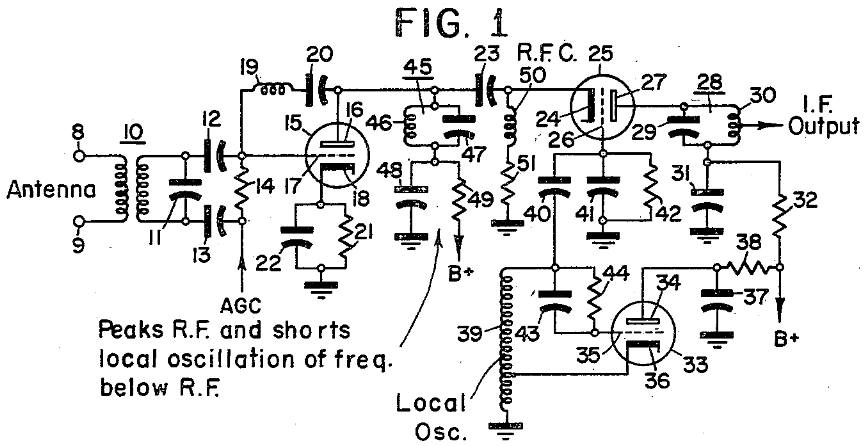
Figure 1 is a schematic diagram of an emobdiment of the invention.

In the circuit of Figure 1, the primary winding of coupling transformer 10 is connected to a pair of input terminals 8 and 9 such as the antenna lead-in wires of a television receiver; a capacitor 11 is connected in parallel with the secondary winding of transformer 10 to form a circuit resonant at the input-signal frequency. Coupling capacitors 12 and 13 are series-connected with the leads from the secondary winding of transformer 10, and a resistor 14 is connected between the terminals of capacitors 12 and 13 remote from capacitor 11. The automatic-gain-control (AGC) circuit of the receiver (not shown) is connected to the bottom of resistor 14. The junction of resistor 14 and condenser 12 is connected to the control grid 17 of an electron-discharge device 15, which also comprises an anode 16 and a cathode 18. A neutralization circuit including a series-connected inductance 19 and a D.-C. blocking capacitor 20 is connected betwen anode 16 and control grid 17 of device 15. A bias resistor 21 is connected between cathode 18 and ground, and a bypass capacitor 22 is connected in parallel with resistor 21; cathode 18 is maintained at ground potential with respect to input-signal frequencies. Anode 16 of device 15 is connected through a coupling capacitor 23, which presents negligible impedance at the input-signal frequency, to the cathode 24 of an electron-discharge device 25, which also comprises a control grid 26 and an anode 27. Anode 27 is coupled to a parallel-resonant output circuit 28 comprising a capacitor 29 and an inductance 30 tuned to the intermediate frequency of the receiver, and a tap on inductance 30 is coupled to the ensuing stages of the receiver (not shown). A bypass capacitor 31 is connected between output circuit 28 and ground. A decoupling resistor 32 is coupled from a point between output circuit 28 and capacitor 31 to a source of positive unidiretcional operating potential, conventionally designated B+; thus a suitable D.-C. operating potential is applied to anode 27 of device 25 through resistor 32 and inductance 30. A radio-frequency choke 50 and a resistor 51 are series-connected between cathode 24 of device 25 and ground, to complete the D.-C. plate current path for device 25.

An electron-discharge device 33, connected as a conventional Hartley oscillator to produce a heterodyne-frequency signal, includes an anode 34, a control grid 35, and a cathode 36. A heterodyne-frequency bypass capacitor 37 is connected between anode 34 and ground, and a decoupling resistor 38 is connected between anode 34 and B+, thereby applying a suitable D.-C. operating voltage to anode 34. The frequency-determining tank circuit comprises an inductance 39 and a pair of capacitors 40 and 41. Capacitor 41 is connected between control grid 26 of device 25 and ground; the first terminal of capacitor 40 is also connected to control grid 26, and the second terminal of capacitor 40 is connected to the top of inductance 39, the bottom of which is connected to ground. A grid resistor 42 is connected between control grid 26 of device 25 and ground. A self-biasing circuit, comprising parallel-connected capacitance and resistance elements 43 and 44, is connected between control grid 35 and the junction of inductance 39 and capacitor 40.

Unlike conventional cascode amplifiers, anode 16 of device 15 is connected to a first terminal of a parallel-resonant circuit 45, comprising an inductance 46 and a capacitor 47 tuned to the input-signal frequency. A capacitor 48 is coupled between the other terminal of resonant circuit 45 and ground, and circuit 45 is returned through a decoupling resistor 49 to B+; thus, a suitable D.-C. operating potential is supplied through resistor 49 and inductance 46 to anode 16 of device 15. Capacitor 48 is series-resonant with the parallel combination of inductance 46 and capacitance 47 at the heterodyne frequency, i. e., the frequency of the signal generated by the oscillator stage comprising device 33. Of course, separate selectable tuned input circuits 10, 11, local oscillator tank circuit 39, 40, 41, and parallel-resonant circuits 45 for each channel, in conjunction with a turret tuner or the like, may be employed to provide reception of all signals throughout the VHF television band.

In operation, radio-frequency input signals are applied through coupling transformer 10 to the resonant circuit composed of the secondary winding of transformer 10 and capacitor 11, thence through capacitors 12 and 13 to resistor 14 and control grid 17. Device 15, with its associated circuitry, functions in essentially the same manner as the first triode of a conventional cascode amplifier circuit. Consequently, an amplified radio-frequency output signal appears at tuned circuit 45, and this amplified signal is coupled to cathode 24 of device 25 through coupling capacitor 23, which presents a negligible impedance to signals of both the input and heterodyne frequencies.

The local oscillator stage, comprising device 33 and its frequency-determining circuitry, supplies a local oscillator signal of the correct heterodyne frequency to control a grid 26 of device 25, thus varying the transconductance of device 25 at the heterodyne frequency; simultaneously, the amplified input-signal from device 15 is applied to cathode 24 of device 25. Capacitor 41, connected between grid 26 of device 25 and ground, is larger than capacitor 40 and is a bypass capacitor for signals of the input frequency. In this embodiment of the invention oscillator stage 33 is tuned to a heterodyne frequency which is lower than the input-signal frequency by an amount corresponding to the intermediate frequency of the receiver. The input-signal and heterodyne frequencies are mixed in device 25 in a manner well known in the art, and signals of four different frequencies appear at anode 27 of device 25: the input signal frequency, the heterodyne frequency, and the sum and difference of the signal and heterodyne frequencies. Signals at these four frequencies are coupled to tuned output circuit 28, which discriminates against the undesired frequencies appearing at anode 27; only the desired intermodulation product, corresponding to the intermediate frequency of the receiver, is developed across output circuit 28 and coupled to the intermediate-frequency channel of the receiver.

The amplified input-frequency signal appearing across resonant circuit 45 is sampled by device 25 as the transconductance of device 25 is varied by injection of the heterodyne-frequency signal on control grid 26. Because circuit 45 is parallel-resonant at the input-signal frequency, circuit 45 presents a very high impedance to the input signal, and practically all of the input-frequency energy appearing at anode 16 of device 15 is coupled through coupling capacitor 23 to cathode 24 of device 25. The heterodyne signal, lower in frequency than the input signal, is simultaneously injected at grid 26 of device 25. Some of the heterodyne-frequency current can be backcoupled from cathode 24 of device 25 through coupling capacitor 23 to the top of parallel-resonant circuit 45; below resonance, parallel-resonant circuit 45 appears inductive. Thus parallel-resonant circuit 45 exhibits a certain inductive reactance at the heterodyne frequency; capacitor 48 is selected to form a series-resonant circuit with the apparent inductance of parallel-resonant circuit 45 at the heterodyne frequency. Because a series-resonant circuit exhibits zero impedance (neglecting losses) at its resonant frequency, any backcoupled heterodyne-frequency current from device 25 is shunted to ground through parallel-resonant circuit 45 and capacitor 48; therefore, there is no possibility of either oscillator radiation from the antenna circuits, or of undesirable conversion in device 15, with the consequent debilitation of the signal-to-noise ratio of that stage.

Looking into cathode 24 of device 25, a time-varying transconductance (caused by injection of the heterodyne frequency signal on grid 26) is seen, shunt-connected with parallel-resonant circuit 45 and capacitor 48. But circuit 45 is parallel-resonant at the input frequency and therefore presents a very high impedance to input-frequency signals; essentially, then, the embodiment of Figure 1 functions as a conventional cascode circuit. The average transconductance exhibited by device 25 is somewhat less than that exhibited by the second stage of a conventional cascode amplifier; therefore, the load impedance which device 25 presents to device 15 is greater than that normally exhibited by the second triode of a conventional cascode amplifier. Hence, the gain of the first stage is somewhat greater than the corresponding gain in an unmodified cascode system; this gain has been found to be two or three times the gain normally realized in this stage. Such gains are still small enough to maintain the inherent advantages of a cascode amplifier.

Figure 2:
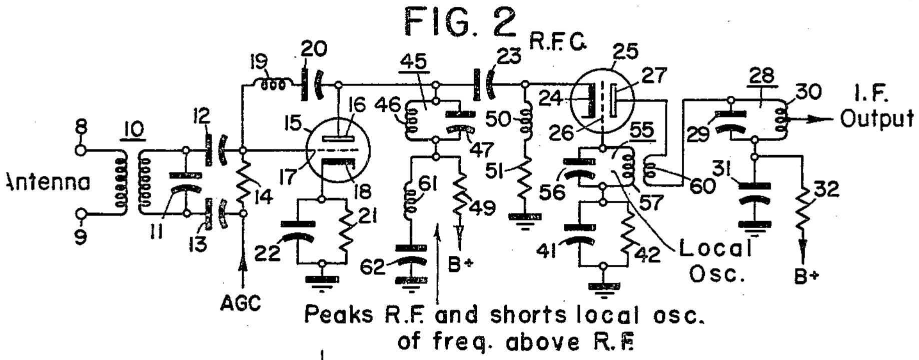
Figure 2 is a schematic diagram of another embodiment of the invention.

The embodiment of Figure 2 is similar to that of Figure 1; however, the local oscillations are generated by the second cascode-coupled stage, thus eliminating device 33 of Figure 1. Moreover, a heterodyne frequency higher than the input frequency is employed. A parallel-resonant circuit 55, comprising a capacitor 56 and an inductance 57 tuned to the heterodyne frequency, is coupled between control grid 26 of electron-discharge device 25 and grid-biasing circuit 41, 42. As in the circuit of Figure 1, condenser 41 effectively bypasses resistor 42 at the input-signal frequency, and since resonant circuit 55 is not tuned to that frequency, grid 26 is effectively maintained at ground potential with respect to the input-signal frequency. A tickler coil 60 is coupled between anode 27 and output circuit 28 of device 25, and is magnetically coupled to coil 57. A series-connected circuit comprising an inductance 61 and a D.-C. blocking capacitor 62 is connected between parallel-resonant circuit 45 and ground; inductance 61 replaces capacitor 48 of Figure 1. Inductance 61 (Figure 2) is selected to resonate with the apparent capacity exhibited by parallel-resonant circuit 45 at the heterodyne frequency; D.-C. blocking capacitor is effectively a short circuit for signals of both the input and the heterodyne frequencies. The remaining elements of Figure 2 are identical to those shown and described in connection with Figure 1.

Circuit 45 is parallel-resonant at the input frequency; therefore, circuit 45 exhibits a capacitive reactance to currents of frequencies higher than the input frequency. In the embodiment shown in Figure 2 the heterodyne frequency is higher than the input frequency, and inductance 61 is chosen to form a series-resonant circuit with the apparent capacitance of parallel-resonant circuit 45 at the heterodyne frequency. Therefore, heterodyne-frequency current is effectively shunted to ground through parallel-resonant circuit 45, inductance 61, and D.-C. blocking capacitor 62. These elements shown in Figure 2 function as do circuit 45 and capacitor 48 of Figure 1 to prevent backcoupling of the heterodyne-frequency current, and, therefore, to obviate the possibility of either local oscillator radiation or undesired conversion in the first triode.

Thus, in accordance with the invention, parallel-resonant circuit 45 presents a high impedance at the input frequency; in each embodiment, the combined effect of the elements of parallel-resonant circuit 45 is to exhibit an apparent reactance of a particular sign at the heterodyne frequency, and this apparent reactance cooperates with a series-connected reactance of opposite sign to form a circuit which is series-resonant at the heterodyne frequency, thereby preventing substantial backcoupling of heterodyne-frequency current to the first triode.

Figure 3:
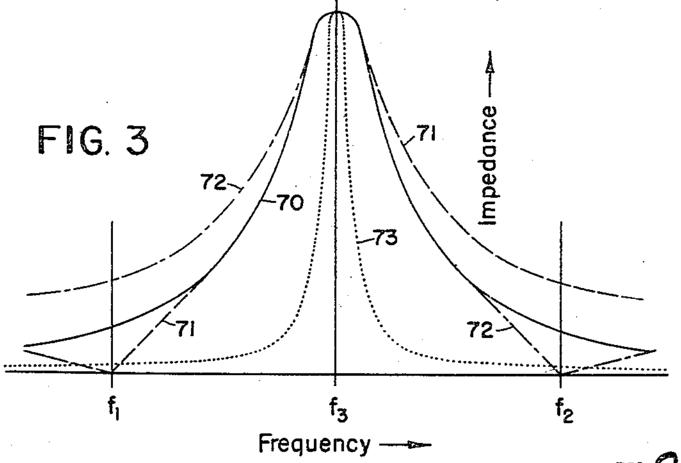
Figure 3 is a graphical representation useful in understanding the operation of the invention.

The variation with respect to frequency of the impedance of parallel-resonant circuit 45, with and without the addition of a series-connected reactance 48 or 61, is shown in Figure 3. Curve 70 depicts the impedance seen looking from anode 16 of device 15 toward cathode 24 of device 25 when no reactance, excepting a D.-C. blocking capacitor, is connected between the lower terminal of circuit 45 and radio-frequency ground. The impedance presented by circuit 45 at its resonant frequency (i. e., the input-signal frequency) is very high; but this impedance is reduced to a much smaller value because a resistance corresponding to the average transconductance of device 25 appears in parallel with circuit 45. The connection of either capacitor 48 or inductance 61 between the lower terminal of circuit 45 and radio-frequency ground to provide a zero-impedance path to ground for current at the heterodyne frequency produces impedance characteristics as shown in curves 71 and 72; $f_3$ represents the resonant frequency of circuit 45 and $f_1$ and $f_2$ represent the heterodyne frequencies of the embodiments shown in Figures 1 and 2, respectively. These characteristics are derived from fundamental considerations of series- and parallel-resonant circuits.

It is apparent that parallel-resonant circuit 45 must preserve a constant LC product to maintain a certain resonant frequency. The "Q" of a resonant circuit with fixed parallel resistance, however, may be varied by changing the L/C ratio; obviously this can be done without affecting the LC product. It is possible, for example, to decrease the inductance of coil 46 by a factor of five while simultaneously increasing the capacity of capacitor 47 by the same factor, preserving a constant LC product while decreasing the L/C ratio by the factor of 25; the effect of thus varying the reactance of circuit 45 is to increase the Q as shown by curve 73 of Figure 3. At points $f_1$ and $f_2$, each of which is spaced from resonant frequency $f_3$ by a distance representing the intermediate frequency, the impedance of curve 73 is low in comparison to that shown in curve 70, although it is not zero as is that of curve 71 and 72 obtained by employing series-connected reactance elements 48 or 61. The series-connected reactance can be eliminated from the embodiments shown in Figures 1 and 2 with only a small degradation of performance (a D.-C. blocking capacitor, such as 62, is still required); but the economy effected by such removal must be balanced against two concomitant disadvantages. The first adverse effect is that the higher-Q parallel-resonant circuit requires more precise tuning and adjustment than does a low Q circuit; this is readily apparent from a comparison of curves 70 and 73 of Figure 3. The second disadvantage is that the physical size of the requisite small inductance at television frequencies poses problems of construction and alignment.

The wave-signal translating circuit of the invention secures economy of operation by combining the frequency-conversion function with the advantage of cascode amplification. A translating circuit having high impedance at the input signal frequency but low impedance at the heterodyne frequency is shunt-connected between the anode of the first triode and radio-frequency ground to prevent backcoupling of the local oscillator signal to or through the first triode; this connection prevents both undesired conversion in the first stage, and objectionable radiation of the local oscillator signal from the antenna circuits. These ends are realized by shunting the heterodyne-frequency signal to ground through the translating circuit, preserving the separation between input and output terminals normally associated with a cascode system. Because the first triode of the amplifier remains unmodified, and because the dynamic cathode resistance of the second triode is increased only slightly, the noise figure and the overall gain of the modified amplifier are substantially the same as those of a conventional cascode system.

While particular embodiments of the invention have been shown and described, it is apparent that modifications and alterations may be made, and it is intended in the appended claims to cover all such modifications and alterations as may fall within the true spirit and scope of the invention.

We claim:

1. A wave-signal translating circuit comprising: a radio-frequency amplifier comprising a first electron-discharge device provided with input and output circuits tuned to a predetermined signal frequency; a second electron-discharge device cascode-coupled to said first device and provided with an output circuit tuned to a predetermined intermediate frequency differing from said signal frequency by a predetermined heterodyne frequency; said first-mentioned output circuit presenting substantially zero shunt impedance to signals of said heterodyne frequency to prevent backcoupling of said heterodyne frequency signals to said radio-frequency amplifier; and means for varying the transconductance of said second device at said heterodyne frequency to cause intermodulation with said signal frequency and develop an intermediate-frequency output signal across said last-mentioned output circuit.

2. A wave-signal translating circuit comprising: a radio-frequency amplifier comprising a first electron-discharge device provided with input and output circuits tuned to a predetermined signal frequency; a second electron-discharge device, comprising a cathode, a control grid, and an anode; means coupling said signal-frequency output circuit to said cathode; an output circuit coupled to said anode and tuned to a predetermined intermediate frequency differing from said signal frequency by a predetermined heterodyne frequency; circuit means of high impedance at said heterodyne frequency and low impedance at said signal frequency coupled between said control grid and a reference potential plane; said first-mentioned output circuit presenting substantially zero shunt impedance to signals of said heterodyne frequency to prevent backcoupling of said heterodyne frequency signals to said radio-frequency amplifier; and means coupled to said circuit means and including said second electron-discharge device for varying the transconductance of said second device at said heterodyne frequency to cause intermodulation with said signal frequency and develop an intermediate-frequency output signal across said last-mentioned output circuit.

3. A wave-signal translating circuit comprising: a radio-frequency amplifier comprising a first electron-discharge device provided with input and output circuits tuned to a predetermined signal frequency; a second electron-discharge device cascode-coupled to said first device and provided with an output circuit tuned to a predetermined intermediate frequency differing from said signal frequency by a predetermined heterodyne frequency; said first-mentioned output circuit comprising parallel-connected reactance elements of opposite sign, one of said reactance elements presenting a high impedance at said heterodyne frequency and the other of said reactance elements presenting a low impedance at said heterodyne frequency; an additional reactance element, of the same sign as said one reactance element, coupled between said first-mentioned output circuit and a reference potential plane and series-resonating with said other reactance element at said heterodyne frequency; and means for varying the transconductance of said second device at said heterodyne frequency to cause intermodulation with said signal frequency and develop an intermediate-frequency output signal across the output circuit of said second device.

4. A wave-signal translating circuit comprising: a radio-frequency amplifier comprising a first electron-discharge device provided with input and output circuits tuned to a predetermined signal frequency; a second electron-discharge device cascode-coupled to said first device and provided with an output circuit tuned to a predetermined intermediate frequency differing from said signal frequency by a predetermined heterodyne frequency higher than said signal frequency; said first-mentioned output circuit comprising parallel-connected inductance and capacitance elements, said inductance element presenting a high impedance and said capacitive element presenting a low impedance at said heterodyne frequency; an additional inductance element coupled between said first-mentioned output circuit and a reference potential plane and series-resonating with said capacitance element at said heterodyne frequency; and means for varying the transconductance of said second device at said heterodyne frequency to cause intermodulation with said signal frequency and develop an intermediate-frequency output signal across the output circuit of said second device.

5. A wave-signal translating circuit comprising: a radio-frequency amplifier comprising a first electron-discharge device provided with input and output circuits tuned to a predetermined signal frequency; a second electron-discharge device cascode-coupled to said first device and provided with an output circuit tuned to a predetermined intermediate frequency differing from said signal frequency by a predetermined heterodyne frequency lower than said signal frequency; said first-mentioned output circuit comprising parallel-connected inductance and capacitance elements, said capacitive element presenting a high impedance and said inductive element presenting a low impedance at said heterodyne frequency; an additional capacitance element coupled between said first-mentioned output circuit and a reference potential plane and series-resonating with said inductive element at said heterodyne frequency; and means for varying the transconductance of said second device at said heterodyne frequency to cause intermodulation with said signal frequency and develop an intermediate-frequency output signal across the output circuit of said second device.

References Cited in the file of this patent

UNITED STATES PATENTS

| | | |
|---|---|---|
| 719,916 | Winfield | Oct. 4, 1955 |

FOREIGN PATENTS

| | | |
|---|---|---|
| 172,350 | Great Britain | Dec. 6, 1921 |
| 409,756 | Great Britain | May 7, 1934 |
| 489,486 | Great Britain | July 22, 1938 |
| 703,946 | Great Britain | Feb. 10, 1954 |

OTHER REFERENCES

"A VHF–UHF Television Turret Tuner," by Murkami, RCA Review, September 1953, pp. 318 to 340, of which only page 324 is cited.